United States Patent
Bronner et al.

(10) Patent No.: US 6,614,074 B2
(45) Date of Patent: *Sep. 2, 2003

(54) GROOVED PLANAR DRAM TRANSFER DEVICE USING BURIED POCKET

(75) Inventors: Gary Bronner, Stormville, NY (US); Toshiharu Furukawa, Essex Junction, VT (US); Mark C. Hakey, Milton, VT (US); Steven J. Holmes, Milton, VT (US); David Horak, Essex Junction, VT (US); Jack A. Mandelman, Stormville, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/092,749

(22) Filed: Jun. 5, 1998

(65) Prior Publication Data

US 2003/0057483 A1 Mar. 27, 2003

(51) Int. Cl.$^7$ .......................... H01L 29/76; H01L 29/94; H01L 31/062; H01L 31/113; H01L 31/119
(52) U.S. Cl. .......................... 257/330; 257/332; 257/334
(58) Field of Search ................................ 257/330, 332, 257/334

(56) References Cited

U.S. PATENT DOCUMENTS

| | | | |
|---|---|---|---|
| 4,119,996 A | | 10/1978 | Jhabvala |
| 4,369,564 A | | 1/1983 | Hiltpold |
| 4,685,196 A | | 8/1987 | Lee |
| 4,830,975 A | * | 5/1989 | Bovaird et al. ............... 437/41 |
| 4,985,368 A | * | 1/1991 | Ishii et al. ..................... 437/38 |
| 4,999,811 A | * | 3/1991 | Banerjee ....................... 365/149 |
| 5,132,238 A | * | 7/1992 | Murakami et al. ............ 437/41 |
| 5,146,426 A | | 9/1992 | Mukherjee et al. |
| 5,338,958 A | * | 8/1994 | Mitsumoto .................... 257/330 |
| 5,371,024 A | * | 12/1994 | Hieda et al. ................... 437/40 |
| 5,408,116 A | * | 4/1995 | Tanaka et al. ................. 257/327 |
| 5,532,179 A | | 7/1996 | Chang et al. |
| 5,640,034 A | * | 6/1997 | Malhi ............................ 257/341 |
| 5,945,707 A | | 8/1999 | Bronner et al. |
| 6,037,194 A | | 3/2000 | Bronner et al. |

OTHER PUBLICATIONS

Oishi T, et al. Narrow–channel Metal Oxide Semiconductor Field effect Transistor (MOSFET) Isolated by an Ultra–Fine Tranceh. Jpn. J. Appl. Phys. vol. 36 (1997) pp. L547–L549.*
Paul–Henri Bricout and Emmanuel Dubois, Short–Channel Effect Immunity and Current Capability of Sub–0.1–Micron MOSFET's Using a Recessed Channel, IEEE Transactions on Electron Devices, vol. 43, No. 8, pp. 1251–1255, Aug. 1996.
Shin'ichiro Kimura, Junko Tanaka, Hiromasa Noda, Toru Toyabe and Siego Ihara, "Short–Channel–Effect–Suppressed Sub–0.1–um Grooved–Gate MOSFET's with W Gate", IEEE Transactions on Electron Devices, vol. 42, No. 1, pp. 94–100, Jan. 1995.
Junko Tanaka, Toru Toyabe, Siego Ihara, Shin'ichiro Kimura, Hiromasa Noda and Kiyoo Itoh, Simulation of Sub–0.1–um MOSFET's with Completely Suppressed Short–Channel Effect, IEEE Electron Device Letters, vol. 14, No. 8, pp. 396–399, Aug. 1993.

* cited by examiner

*Primary Examiner*—Long Pham
*Assistant Examiner*—Shrinivas H. Rao
(74) *Attorney, Agent, or Firm*—Scully, Scott, Murphy & Presser; Mark F. Chadurjian, Esq.

(57) ABSTRACT

A grooved planar DRAM transfer device having a grooved gate formed in a groove in a substrate located between source and drain regions. The grooved gate has sidewall portions and a bottom portion which defines a channel therealong. The bottom portion includes a doped pocket such that the threshold voltage Vt on the bottom portion is substantially less than Vt on the sidewall portions, such that the sidewall portions predominantly control electric current through the device.

13 Claims, 12 Drawing Sheets

GROOVED PLANAR DRAM TRANSFER DEVICE USING BURIED POCKET

BACKGROUND OF THE INVENTION

1. Technical Field

The present invention relates generally to a grooved planar DRAM transfer device, and more particularly pertains to a grooved planar DRAM transfer device having a grooved gate formed in a groove in a substrate located between source and drain regions. The groove gate has sidewall portions and a bottom portion which defines a channel therealong. The bottom portion includes a doped pocket such that the threshold voltage Vt on the bottom portion is substantially less than Vt on the sidewall portions, such that the sidewall portions predominantly control electric current through the device.

In prior art FETs having a grooved trench in the channel, a corner of the groove images charge over a larger area around the semiconductor corner. Thus, a higher gate voltage is needed to image the same density of charge. The effect is like a thicker gate oxide or a lower gate voltage. Sub Vt slope is also degraded because lower coupling to silicon results in less current when the device is on.

2. Prior Art

Grooved planar DRAM transfer devices are described in DRAM Cell WITH GROOVED PLANAR TRANSFER DEVICE, U.S. Ser. No. 09/056,903, filed Apr. 7, 1998, the specification of which is expressly incorporated by reference herein, and are promising for very high-density DRAMs (less than 7 square) because of their greatly reduced short channel effects. However, it has been discovered that a gate electric field reduction at the bottom corners of the groove produces electric potential barriers which are deleterious to the electrical characteristics of the device. Furthermore, variations in the geometry of the bottom part of the groove (i.e., variations in the radius of curvature) can cause considerable variations in the electrical performance characteristics of different devices.

Prior art exists which recognizes the degradation in device characteristics due to the bottom corners [IEEE EDL, Vol. 43, No. 8, August 1996, pp. 1251–1255; IEEE TED, Vol. 42, No. 1, January 1995, pp. 94–100; IEEE EDL, Vol. 14, No. 8, August 1993, pp. 396–399]. Moreover, U.S. Pat. No. 5,408,116 seeks to minimize the deleterious effects at the bottom corners by controlling the radius of curvature of the corners to decrease the Vt.

Some prior art describes selectively doping a corner or an edge of a channel to raise Vt of that part of the channel for a DRAM transfer device which is bounded by STI (Shallow Trench Isolation). In that case, the invention seeks to suppress current along an STI bounded edge in a direction which is parallel to the channel. Furthermore, in the prior art the surface of the semiconductor corner which is being doped to raise Vt is convex with respect to the gate conductor. This geometry enhances the gate electric field in the silicon, lowering the Vt and requiring higher doping of the same type as the surrounding semiconductor.

The present invention is distinguished therefrom by the fact that the region being doped extends across the entire width of the channel, so that all current flows through the doped region, and by the fact that the Vt of the region is being lowered. The present invention also distinguishes from the prior art by the fact that N-type doping is provided to lower Vt (in an NMOSFET), and by the fact that the doping cuts across the channel like a a crossing walk cuts across a road.

SUMMARY OF THE INVENTION

Accordingly, it is a primary object of the present invention to provide an improved grooved planar DRAM transfer device using a buried pocket.

The present invention provides a method for completely eliminating the bottom corner potential barriers and the deleterious influence of the bottom of the groove on the device electrical characteristics, and thereby provides a DRAM transfer MOSFET which is superior to the prior art.

The subject invention provides a pocket at the bottom of the groove with N-type doping, and so does not use the length along the bottom and its corners, just the gain in length along the sidewalls. The doping at the bottom of the groove can be N-type or more lightly doped P-type in an NMOSFET. In a PMOSFET, doping polarities are reversed.

The level of doping modification at the bottom of the grooves depends on the radius of curvature of the bottom corners. Grooves having a small radii of curvature may require complete compensation of the dopant at the bottom of the groove (i.e. P-type dopant in an NMOSFET converted to N-type dopant, an N-type pocket). Where the radius of curvature is large, merely reducing the P-type concentration at the bottom of the groove suffices to lower the threshold voltage to an acceptable level.

The present invention provides a method of eliminating the potential barriers at the bottom corners of the groove, thus resulting in more tightly controlled device characteristics.

The present invention forms a buried N-layer or lightly doped buried P-layer at the bottom of the groove in a grooved NFET device. The buried layer may be formed by an ion implant of an N-type impurity such as phosphorus or arsenic. Implant scattering and subsequent thermal budget result in the spreading of the N-dopant such that the net doping at the bottom corners of the groove becomes N-type. The concept is to lower the Vt at the bottom corners. Depending on radius of curvature of the corners, lightly doped P-type may suffice.

The present invention provides a semiconductor structure having a corner region which is selectively doped to lower the Vt of that region. In greater detail, the semiconductor structure comprises a transistor having a channel, and a groove extending across the channel, and the corner region is a corner of the groove. The transistor comprises a source, a drain, and a channel. The channel has a center region between the source and drain, and selective doping is provided extending across a portion of the center region but not extending to the source and drain.

BRIEF DESCRIPTION OF THE DRAWINGS

The foregoing objects and advantages of the present invention for a grooved planar DRAM transfer device using buried pocket may be more readily understood by one skilled in the art with reference being had to the following detailed description of several preferred embodiments thereof, taken in conjunction with the accompanying drawings whereon like elements are designated by identical reference numerals throughout the several views, and in which.

DETAILED DESCRIPTION OF THE DRAWINGS

Figure 1:
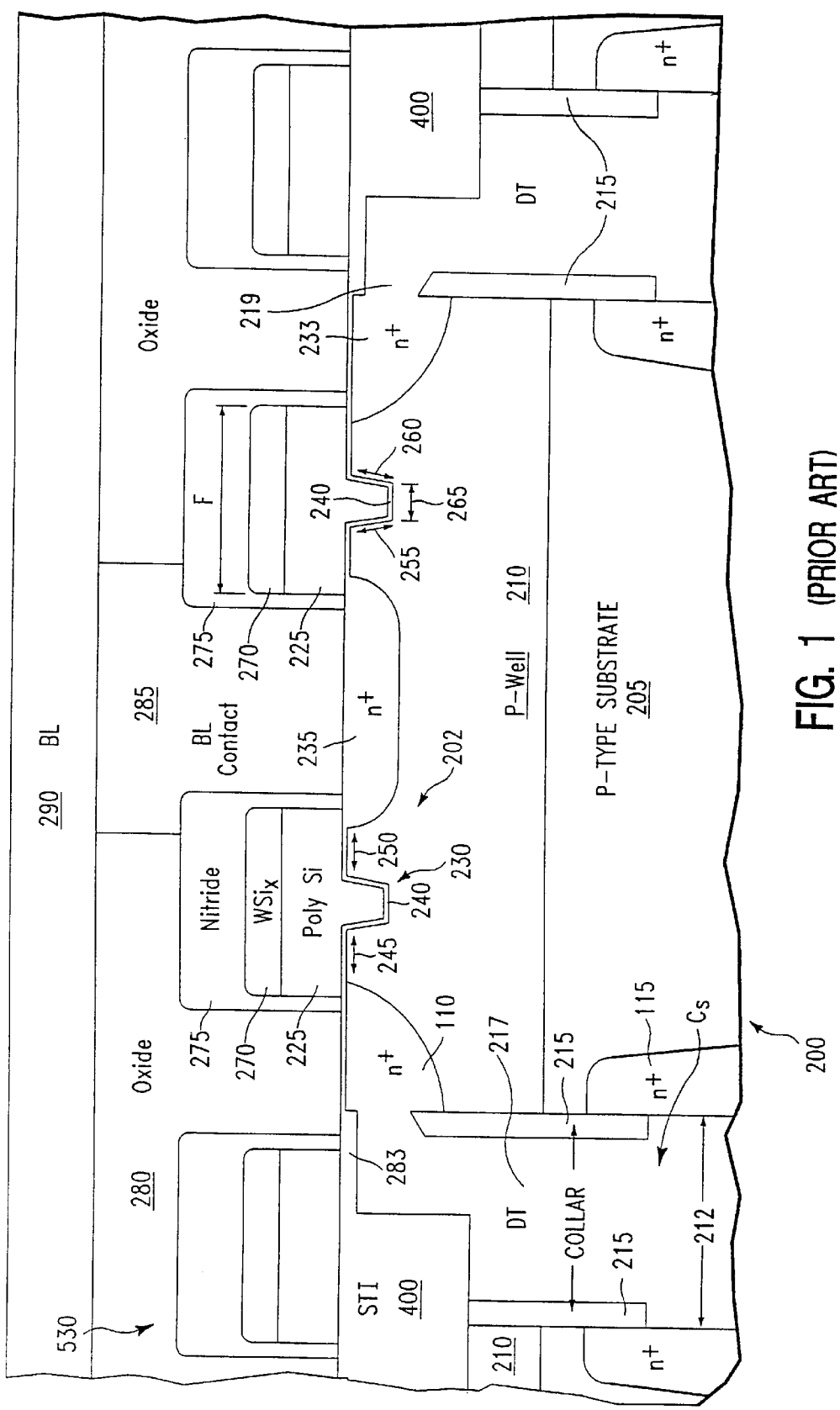
FIG. 1 illustrates the structure of a grooved planar trench DRAM cell.

For the successful design of DRAM array MOSFETs, the wordline boost level must be sufficiently high to assure rapid and efficient charge transfer between the storage capacitor and the bitline. This means that the wordline boost level must be chosen to result in a sufficient margin above the highest threshold voltage which may occur due to variations in electrical operating conditions and processing tolerances. However, it must also be assured that the gate dielectric be able to withstand reliability degradation due to the repeated application of the wordline high level (boosted wordline level) which occurs during reading, writing, and refreshing of data which is stored on the cell capacitor. Therefore, the minimum allowable thickness of the gate dielectric is determined by the boost voltage requirement and maximum permissible electric field in the gate dielectric. Ideally, it is desirable that the gate dielectric thickness scale at the same rate as the minimum feature size, F. However, because the highest threshold voltage which may occur is dictated by the off-current requirement for the MOSFET and the sensitivity of the threshold voltage to variations in electrical operating conditions and processing tolerances, the minimum allowable gate dielectric thickness is essentially independent of F. As a result of this constraint on the minimum gate dielectric thickness, for contemporary DRAM technology, as F is made smaller the thickness of the gate dielectric increasingly departs from the value it should be for a MOSFET which is properly designed according to well known scaling theory. For example, if F is equal to 0.15 $\mu$m the minimum gate dielectric thickness (as constrained by required boost voltage and maximum electric field) is in the range of 4.5 to 5.5 nm. To limit the sensitivity to short and narrow channel effects, MOSFET design requires that the gate dielectric thickness be no greater than approximately 3% of the designed channel length. Clearly, this is not the case for contemporary DRAM devices using minimum feature size, F, of 0.15 $\mu$m and smaller.

As a consequence of a thicker than desired gate dielectric, the threshold voltage of the MOSFET has an increased sensitivity to processing tolerances and operating voltage variations. Since the range of variation in threshold voltage has increased, it is necessary to increase the channel doping such that the lowest possible threshold voltage still assures that the MOSFET is sufficiently turned-off to prevent the leakage of charge from the storage capacitor. This increase in channel doping leads to increased junction leakage because of high-field effects in the presence of silicon defects, which is detrimental for data retention time. Thus we have a vicious cycle, the end result being that contemporary conventional planar DRAM array MOSFETs have a hypersensitivity to processing tolerances and operating voltage variations.

Processing tolerances give rise to variations in MOSFET channel length and width. It is well known in the art that variations in channel length and width result in variations in threshold voltage. For contemporary DRAM array MOSFETs these variations are amplified by a thicker than desired gate dielectric. Additionally, large sub-threshold swing and high substrate sensitivity, which are other consequences of a thicker than desired gate dielectric, add to the overall variation in threshold voltage.

Presently, DRAM technology falls into two main camps, use of stacked capacitor storage elements and use of deep trench storage capacitors. Each approach has certain advantages and disadvantages relative to the other. For example, deep trench technology results in improved planarization of the various layers of the structure which facilitates the ultra-fine lithographic and etching processes required for todays DRAMs. On the other hand, the most widely used trench storage technology (as illustrated by the DRAM cross-section shown in FIG. 8) utilizes a buried-strap to form the connection between the array MOSFET and the storage capacitor. The buried-strap has a very deep diffusion associated with it which is highly detrimental to the scalability of the MOSFET. In past DRAM generations, when the state of the art used a minimum feature size, F, which was larger than approximately 0.5 $\mu$m the presence of the deep buried-strap diffusion did not pose much of a problem for the electrical characteristics of the MOSFET. However, with present day DRAM designs approaching minimum feature size equal to 0.15 $\mu$m, typical buried-strap diffusions approximately 0.20–0.25 $\mu$m deep are much deeper than what is desired for proper scaling (shallower than 0.05 $\mu$m).

Since process tolerances associated with the formation of the buried strap are large and are difficult to scale, the buried-strap junction depth is not amenable to reduction. Stacked capacitor designs are able to use shallower diffusions since the capacitor is above the surface of the silicon; however, the deep-buried strap diffusion for the trench DRAM array MOSFET results in a much increased sensitivity to variations in threshold voltage. Corresponding to the variation in threshold voltage is a very large variation in off-current. With very short channel devices, it is possible that the off-current may vary over several orders of magnitude as a result of variations in the distance between the buried-strap diffusion and the bitline diffusion. To assure that the maximum off-current, under worst case conditions, is sufficiently small to guarantee that charge loss from the storage capacitor does not degrade signal integrity, it is necessary to increase the nominal doping in the channel of the MOSFET. However, increased channel doping is associated with increased junction leakage, which is also detrimental to signal integrity.

A grooved MOSFET provides excellent immunity from variations in electrical characteristics due to encroachment of the buried strap and changes in drain to source voltage. However, formation of potential barriers at the bottom corners of the groove degrade sub-threshold swing and substrate sensitivity.

FIG. 1 illustrates a cross section of a memory cell 200. The memory cell includes a semiconductor device, such as a field effect transistor (FET), formed in a substrate 205 doped with P-type material, for example, having a P-well 210 formed therein. A capacitor plate 115 is formed in the substrate 205 by forming an N+ region 115 in the substrate 205.

A deep trench (DT) is etched into the substrate 205 and the storage capacitor plate 115 is formed by out-diffusing N+ dopant from the DT sidewalls.

Node dielectric 212 is formed and the deep trench (DT) is filled with doped polysilicon. The polysilicon is recessed, and an insulating collar 215 is formed on the top sidewall portions of the deep trench DT, which is then filled with doped polysilicon 217. The insulating collar 215 is excluded from an upper part 219 of one of the top DT sidewall portions in order to out-diffuse a strap 110 from the DT polysilicon 217.

The DT polysilicon 217 is recessed again to expose parts of the collar 215, which is silicon oxide for example. The exposed collar is etched and the recess is filled again with polysilicon 217, from which the strap 110 is out-diffused to connect the DT polysilicon 217 to the source/drain of the transfer device 202. The storage node 110 of the capacitor is the source or drain region of an FET 202 formed in the P-well 210. As shown in FIG. 1, a shallow trench isolation STI region 400 covers a portion of the deep trench DT.

The FET 202 has a grooved gate 225 formed in a groove 230, which is formed in the P-well 210 between the source and drain N+ regions 110, 235 of the FET 202. The grooved gate 225 extends beyond the groove 230 over the substrate, and the source or drain regions 110, 235 are self-aligned to the gate 225, for example. Illustratively, the source or drain regions 110, 235 are heavily doped N+ regions in the P-well 210.

The groove 230 may be self aligned to be at the center of the gate 225, for example. Alternatively, the groove 230 is not self-aligned, and may be anywhere below gate 225. A thin layer of gate oxide 240 separates the gate 225 from the FET channel in the P-well 210. The groove 230 extends the width of the FET channel. The groove 230 also extends the length of the FET channel to include the sidewalls and bottom width of the groove 230, which channel length is shown as reference numerals 255, 265, 260 in FIG. 1. In addition, to further extend the channel length, the groove 230 is separated from the source/drain N+ regions 110, 235 so that the channel length is increased to include lateral distances 245, 250, shown in FIG. 1. With extremely small groundrules, (i.e. minimum feature size, F) 245, 250 may vanish. This results in the diffusions 110 and 235 being directly at the sidewalls of the groove.

The gate 225 is formed of polysilicon, which may be doped with either N+ or P+ impurities, and acts as the wordline W/L of the memory cell 200. In this embodiment, portions of the gate 225 extend over the P-well 210. This extends the gate 225 beyond the groove 230 to control the resistance of the FET channel, which is located in the P-well 210 between the source/drain N+ regions 110, 235. The groove 230 and grooved gate 225 extend the length of the channel to include the distances 245, 250 between the groove 230 and the source/drain N+ regions 110, 235, the distances 255, 260 of the groove sidewalls, and the bottom width 265 of the groove 230.

Exposed stripes are used to form the grooves 230, which are only formed in the active regions AA by selective etching the silicon substrate to the surrounding insulating layer.

Illustratively, the grooves 230 are formed by patterning a mask to cover areas other than the exposed stripes. The shallow trench isolation regions STI shown in FIG. 1 surround the active regions AA. As shown in FIG. 1, an insulating layer 283 covers the portion of the active regions AA that overlaps the deep trench DT. The deep trenches DT as well as the bit line contacts CB, are shown in FIG. 1 as reference numeral 285.

A shallow trench isolation region (STI) 400 is formed in the substrate, e.g., over portions of the deep trench DT, to isolate the FET 202 from other devices formed in the substrate. Illustratively, the STI regions 400, the top covers 283 of the deep trenches DTs, and the collars 215 are oxides of silicon.

As shown in FIG. 1, the depth of the STI regions 400 is greater than the depth of the groove 230. This fully isolates the memory cell 200 from other adjacent devices, such as other memory cells that form an array of memory cells. Having STI regions 400 that are deeper than the groove 230 reduces leakage of charges stored in the deep trench capacitor $C_s$ when the FET 202 is in the OFF state. Otherwise, large leakage occurs which detrimentally degrades the performance of the memory cell 200 and prevents its use as a DRAM cell.

If the depth of isolation region STI is less than the depth of the groove 230, then leakage is particularly pronounced at the ends of the groove 230. Thus, having isolation regions STI that are deeper than the groove depth minimizes leakage, including leakage at the groove ends. More specifically, leakage between the bottoms of adjacent grooves.

As shown in FIG. 1 a gate conductor 270, such as a tungsten W or a tungsten silicide $WSi_x$ layer for example, is formed over the gate 225. The gate 225 and gate wiring 270 have a width that equals a minimum lithographic feature size F. Accordingly, the width of the groove 230 located below a portion of the gate 225 is less than the feature size F.

An insulator or dielectric 275, such as a nitride, is formed to cover the gate wiring 270 and sidewalls of the gate 225. An oxide layer 280 is formed over the memory cell 200 and is etched selectively to the insulator 275 to form a bit line contact opening that exposes the source and drain N+ region 235 located furthest from the deep trench DT. The opening over the exposed N+ region 235 is filled with a conductive material to form the bit line contact 285 borderlessly to the word-line or gate 225. Finally, a bit-line 290 is formed over the oxide layer 280 to connect various bit line contacts 285 arranged in rows of the array formed from many of the memory cells 200 arranged in rows and columns.

The source and drain regions 110, 235 are located along the length of groove 230 and the channel is located in the P-well 210 along the lateral, sidewalls and bottom portions of the gate 225. The length of the channel is the sum of the lateral distances 245, 250 between the source/drain regions 110, 235, the distances 255, 260 of the sidewalls of the groove 230, equaling approximately twice the depth of the groove 230, and the width 265 of the groove 230. In other embodiments to be described, the gate 225 may be confined within the groove 230, and the source/drain regions 110, 235 abut the groove 230. In this case, the length of the channel is approximately the distances 255, 260 of the groove sidewalls plus the groove bottom width 265.

As shown in FIG. 1, the channel sidewall sections located along the gate sidewall portions 255, 260, each or together, have a larger length than the length of the bottom channel section located along the gate bottom portion 265. If desired, the groove 230 may be deeper so that each sidewall length 255 or 260 is greater than the bottom width 265. Having larger sidewalls sections than a bottom section allows the gate sidewall portions 255, 260 to predominantly control the memory cell 200.

By contrast, conventional grooved devices have the predominant portion of the channel at the bottom of the grooved gate, as opposed to the sidewalls of the groove, and are controlled by the bottom portion of the grooved gate or channel, instead of the sidewall portions thereof. Controlling the FET or memory cell by the grooved gate's sidewalls provides substantial benefits, such as increased channel length, improved shielding from penetration of drain electric field to the source, referred to as drain induced barrier lowering (DIBL), and a threshold voltage which is independent of the dimensions of the groove, particularly the width of the groove. By using the sidewalls of the groove to control the threshold voltage $V_t$ of the MOSFET array, the doping in the channel may be reduced, thus avoiding degradation, i.e., increase, of junction leakage due to high doping effects.

FIG. 1 illustrates the structure of a grooved planar trench DRAM cell using a grooved transfer device in which the portion 225 of the wordline which lies in the groove 230 provides an electrical shield between the bitline diffusion 235 and the node diffusion 110. This results in greatly reduced Vt lowering due to the proximity of the node diffusion 110 and storage trench DT to the bitline diffusion 235. Therefore, the grooved planar DRAM transfer device appears to have potential for dense DRAM designs which require minimizing the source barrier lowering.

It has been recognized that the intensity of the gate oxide field at the bottom corners of the groove 230 is reduced, relative to the field on the remainder of the channel, because of the concavity of the silicon surface. This makes the bottom corners behave as if they have a substantially thicker oxide than their actual physical thickness. Barriers in the electric potential at the surface of the silicon appear at the bottom corners.

Figure 2:
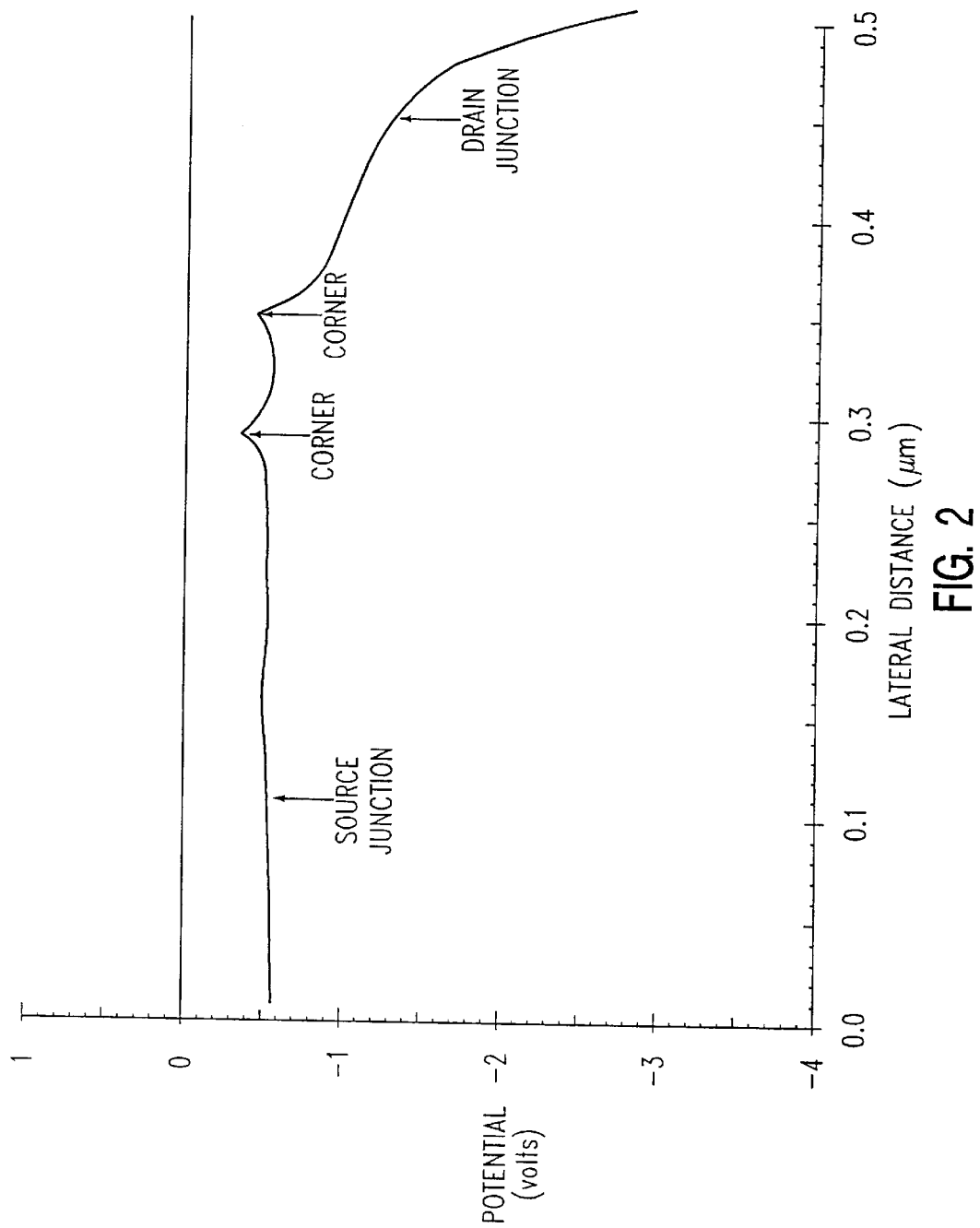
FIG. 2 illustrates the simulated hole potential energy along the surface of a grooved PMOSFET, and shows the potential barriers at the bottom corners thereof.

FIG. 2 illustrates the simulated hole potential energy along the surface of a grooved PMOSFET; the higher potential barriers at the bottom corners are apparent. These electric potential barriers result in degraded sub-Vt slope, higher substrate sensitivity and decreased on-current. Due to process variations, the curvature of the bottom of the groove may vary. For example, variations in groove width, vertical etching, etch sidewall angle and oxidation all result in variations in the device electrical characteristics.

The present invention teaches the formation of a buried N-layer or pocket at the bottom of the groove 230 in a grooved NFET device. The buried layer may be formed by an ion implant of an N-type impurity such as phosphorus or arsenic. Implant scattering and subsequent thermal budget result in the spreading of the N-dopant such that the net doping at the bottom corners of the groove becomes N-type or lightly doped P-type.

A typical process sequence for modifying the doping at the bottom of the groove 230 to optimize device characteristics in a self-aligned grooved planar NMOSFET DRAM device as disclosed in patent application U.S. Ser. No. 09/056,903, DRAM Cell with Self-Aligned Grooved Planar Transfer Device is described in detail herein with the reference to FIGS. 3 and 4.

Figure 3:
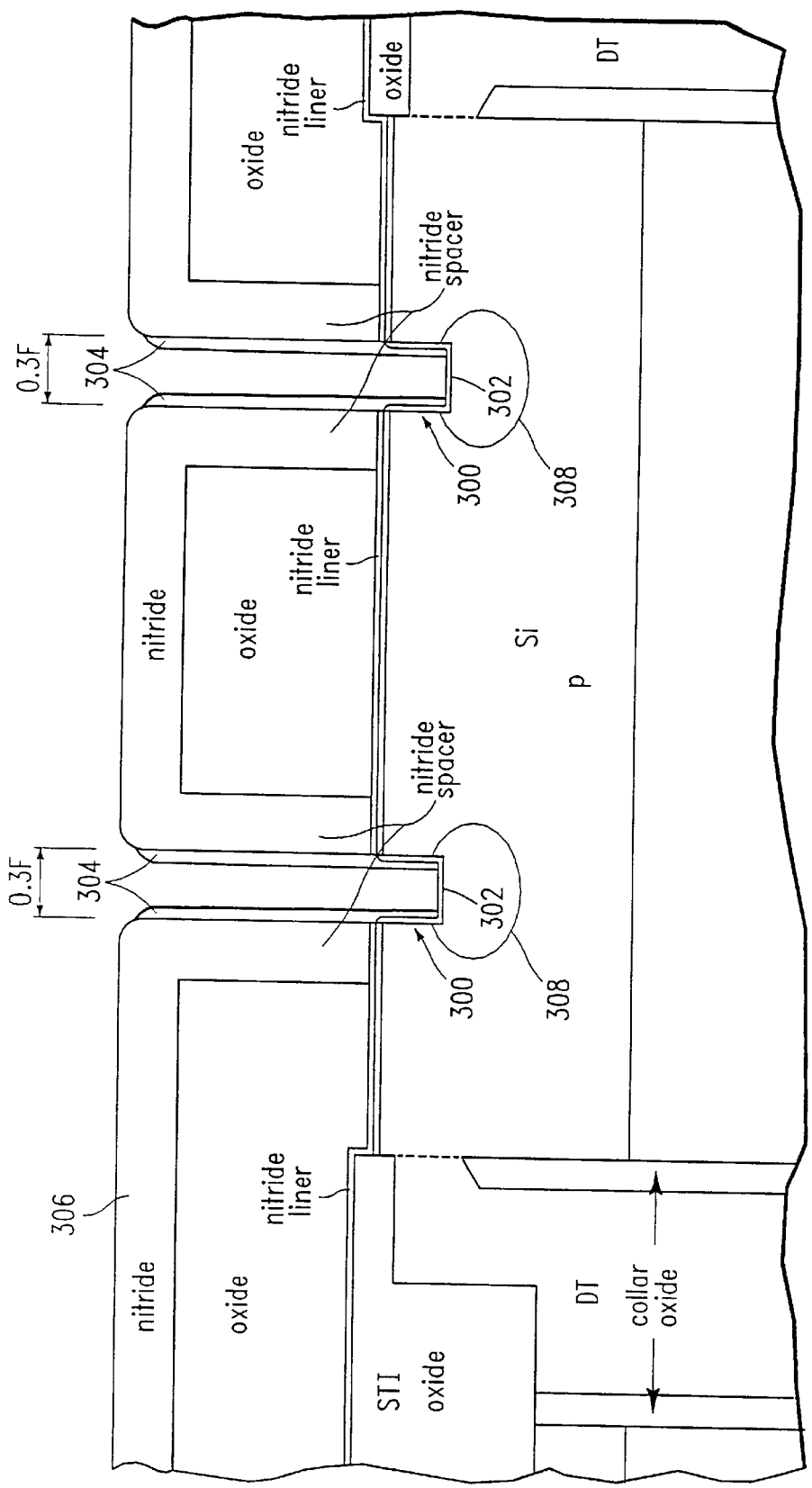
FIG. 3 illustrates a DRAM structure after formation of sacrificial poly spacers.

1. Referring to FIG. 3, following the etching of a groove 300 (analogous to as described in patent application U.S. Ser. No. 09/056,903, a sacrificial oxide 302 is grown on the surface of the exposed silicon.

2. Polysilicon spacers 304 are then formed on the sidewalls of the groove 300. The purpose of the poly spacers 304 is to ensure that the subsequent implant for the N-pocket doesn't contaminate the sidewalls of the groove. If the groove sidewalls are substantially vertical, the use of the protective polysilicon spacers may not be necessary.

3. Alternatively, following the etching of the groove and before the sacrificial oxidation, a short silicon etch (isotropic) can be performed. This etch removes any poly stringers that may later form in the sidewalls of the oxide isolation region (STI) and can result in source to drain shorts. Additionally, the short silicon etch recesses the silicon sidewall under the thick nitride layer 306 (which masked the groove etch). Since the silicon is recessed under the nitride, any additional spacers that were used to block the subsequent pocket implant from doping the sidewalls are now unnecessary.

4. An N-type dopant is then implanted to form an N-pocket 308 at the bottom of the groove. For lower dose N-type implants, the bottom of the groove may be partially compensated, resulting in lightly doped P-type.

5. Subsequent thermal budget drives the dopant laterally to assure that the bottom corners of the groove 300 receive the N-type dopant.

6. The groove is now cleaned out (any poly spacers and sacrificial oxide are removed) and a gate oxide is grown.

7. Normal processing is then resumed, as described in patent application U.S. Ser. No. 09/056,903.

Figure 4:
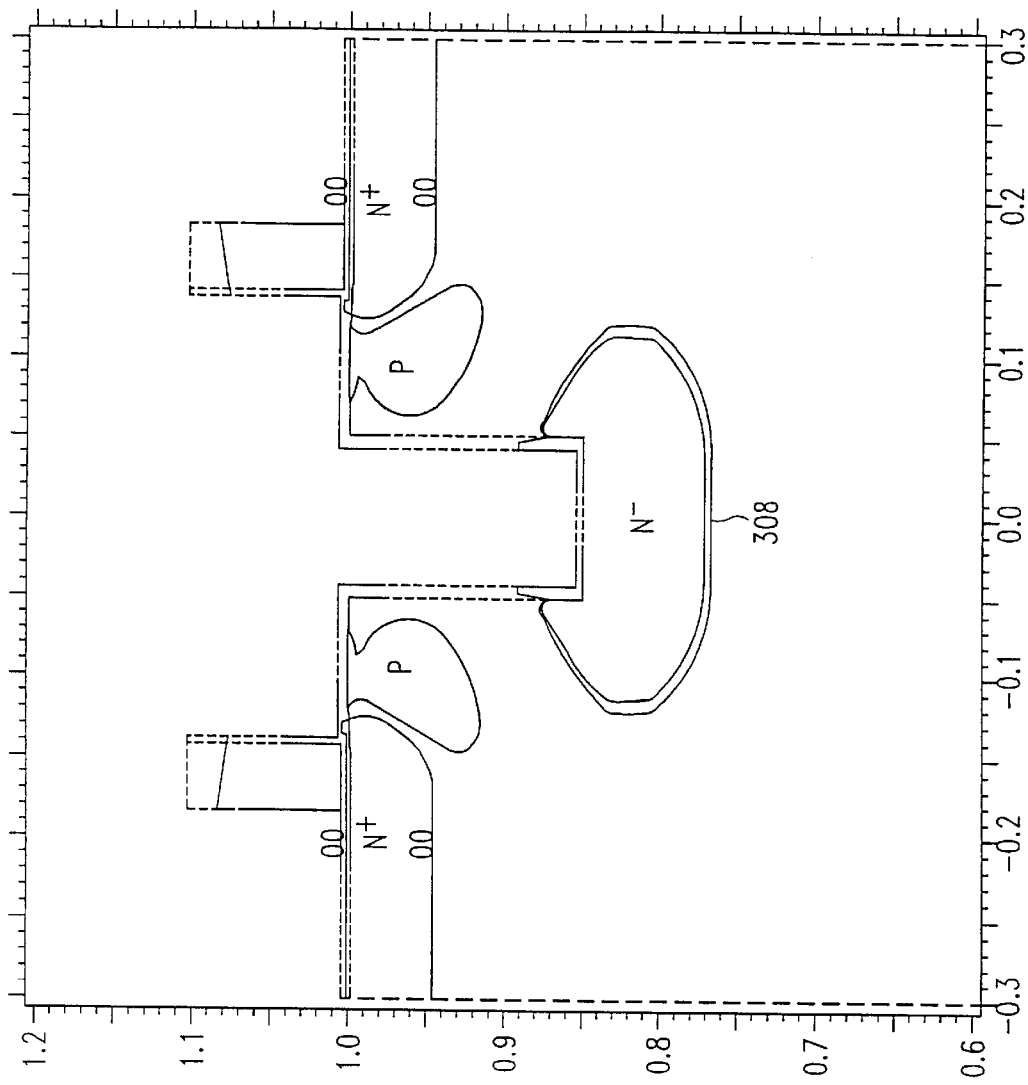
FIG. 4 shows simulated equi-concentration doping contours for a grooved MOSFET containing an N-pocket at the bottom of the groove.

FIG. 4 shows simulated equi-concentration doping contours for a grooved MOSFET containing an N-pocket 308 at the bottom of the groove.

Figure 5:
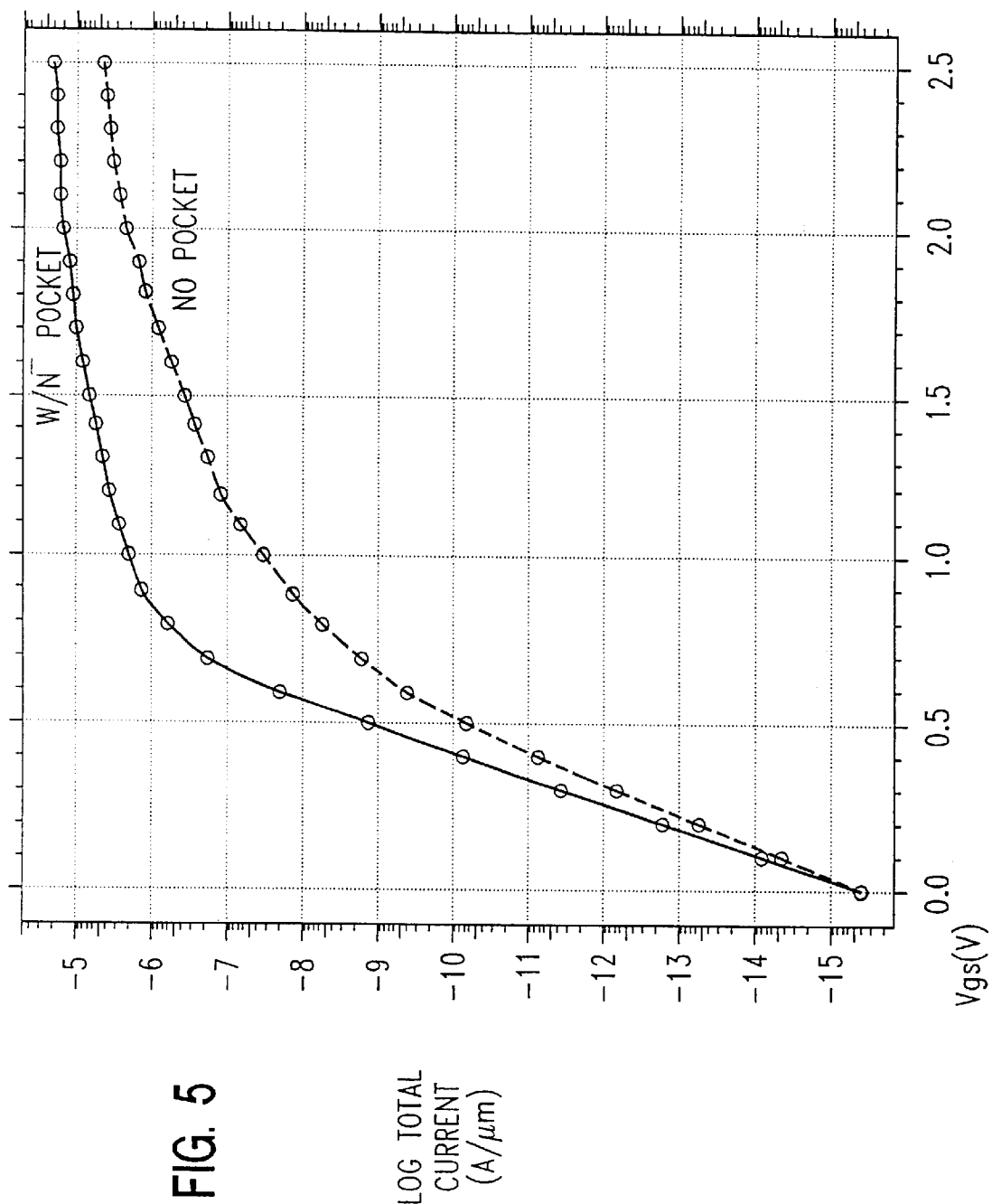
FIG. 5 compares simulated linear region Id-Vgs characteristics of a grooved MOSFET containing an N-pocket to one which does not have a pocket.

FIG. 5 compares simulated linear region Id-Vgs characteristics of a grooved MOSFET containing an N-pocket to one which does not have a pocket. It is clear that the potential barriers at the bottom of the groove for the MOSFET without the N-pocket seriously degrade its subthreshold slope.

Figure 6:
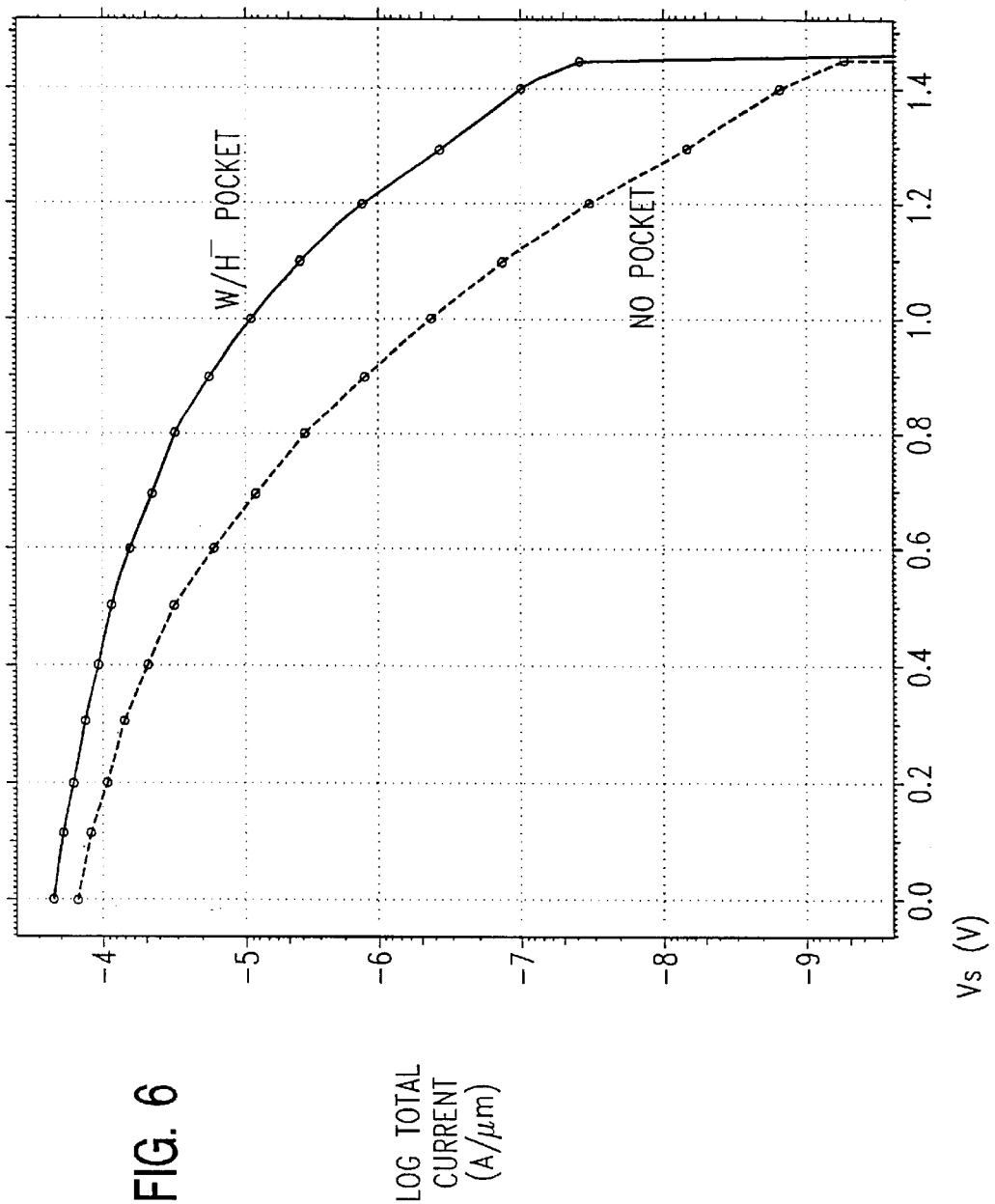
FIG. 6 illustrates a comparison of the writeback characteristics of the two grooved MOSFETs, wherein current charging the storage capacitor is plotted vs the voltage on the capacitor.

FIG. 6 illustrates a comparison of the writeback characteristics of the two grooved NMOSFETs. Here, current charging the storage capacitor is plotted vs the voltage on the capacitor. As the capacitor charges up during the writeback of a "1" level, the back bias on the device increases and Vgs decreases, causing the current to drop off rapidly. For equal off-currents, the grooved MOSFET having the N-pocket has a nominal Vt which is approximately 300 mV lower than the device without the pocket. Additionally, the absence of the potential barriers in the MOSFET with the pocket result in lower substrate sensitivity and steeper sub-Vt slope. These differences contribute to far superior charging current for the grooved device containing the pocket.

Figure 7:
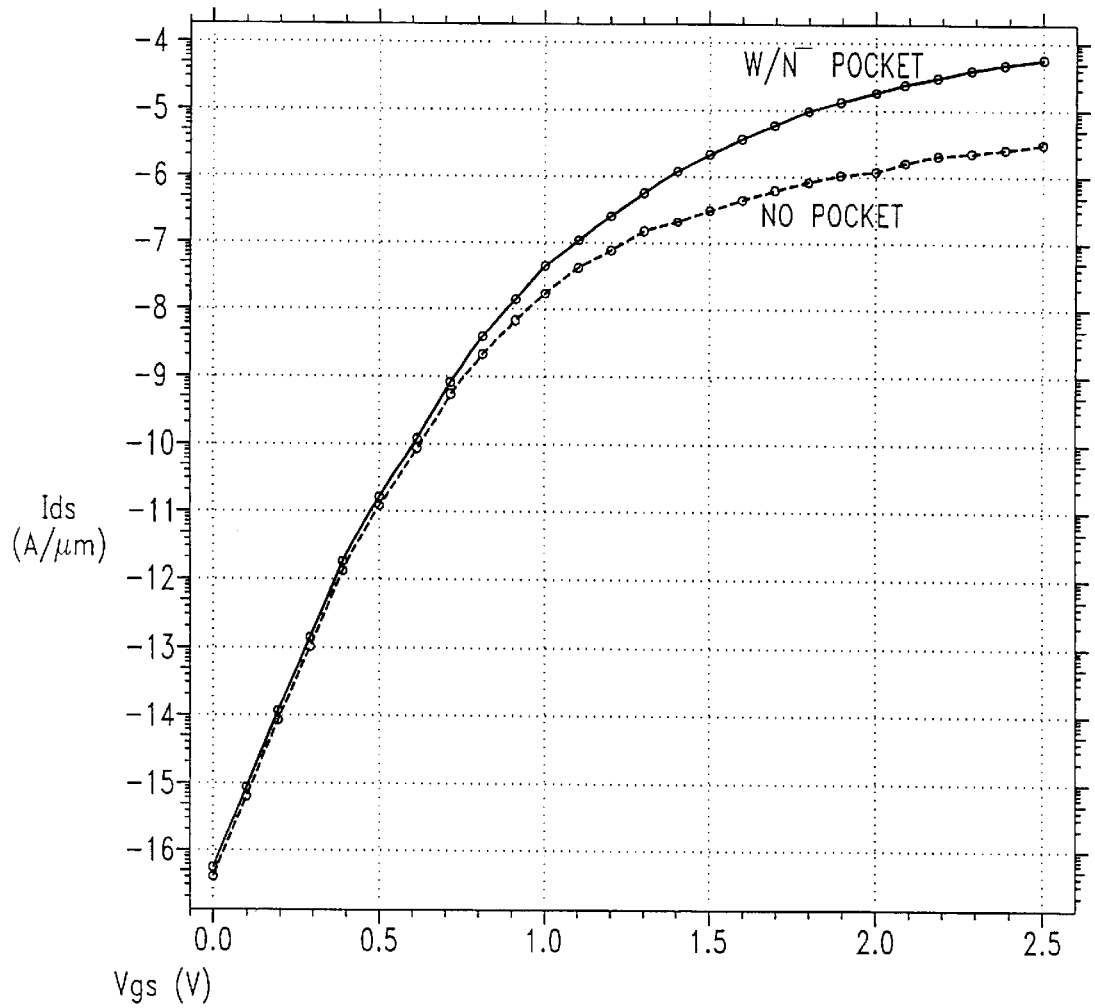
FIG. 7 illustrates the sensitivity of the grooved MOSFET to DIBL, and shows that the sub-Vt region shifts by only approximately 20 mV when the drain voltage is increased from 0.1 to 2.5V.

FIG. 7 illustrates the sensitivity of the grooved MOSFET to DIBL, and shows that the sub-Vt region shifts by only approximately 20 mV when the drain voltage is increased from 0.1 to 2.5 V.

Figure 8:
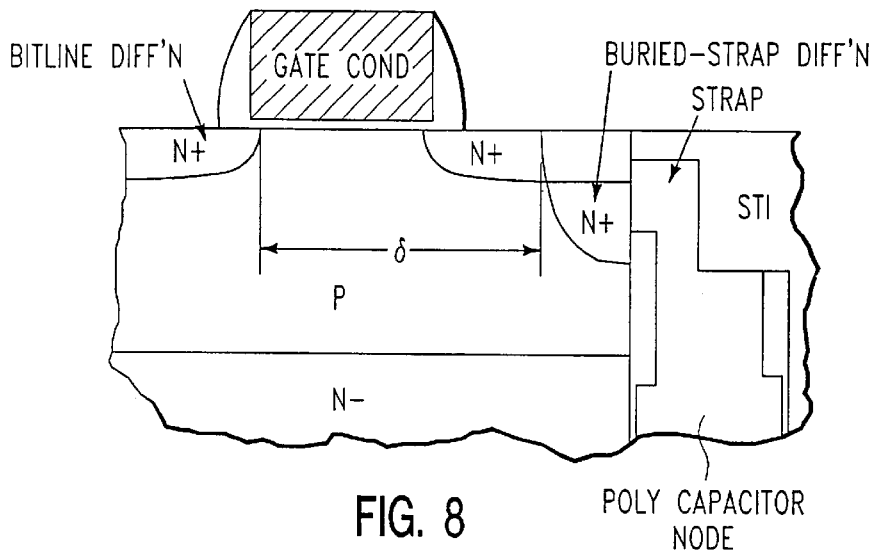
FIG. 8 illustrates the distance between the bitline diffusion and the buried-strap diffusion in a trench DRAM cell using a planar MOSFET.

FIG. 8 illustrates the distance between the bitline diffusion and the buried-strap diffusion in a trench DRAM cell using a planar MOSFET. As groundrules and cell designs are scaled down, δ gets smaller.

Figure 9:
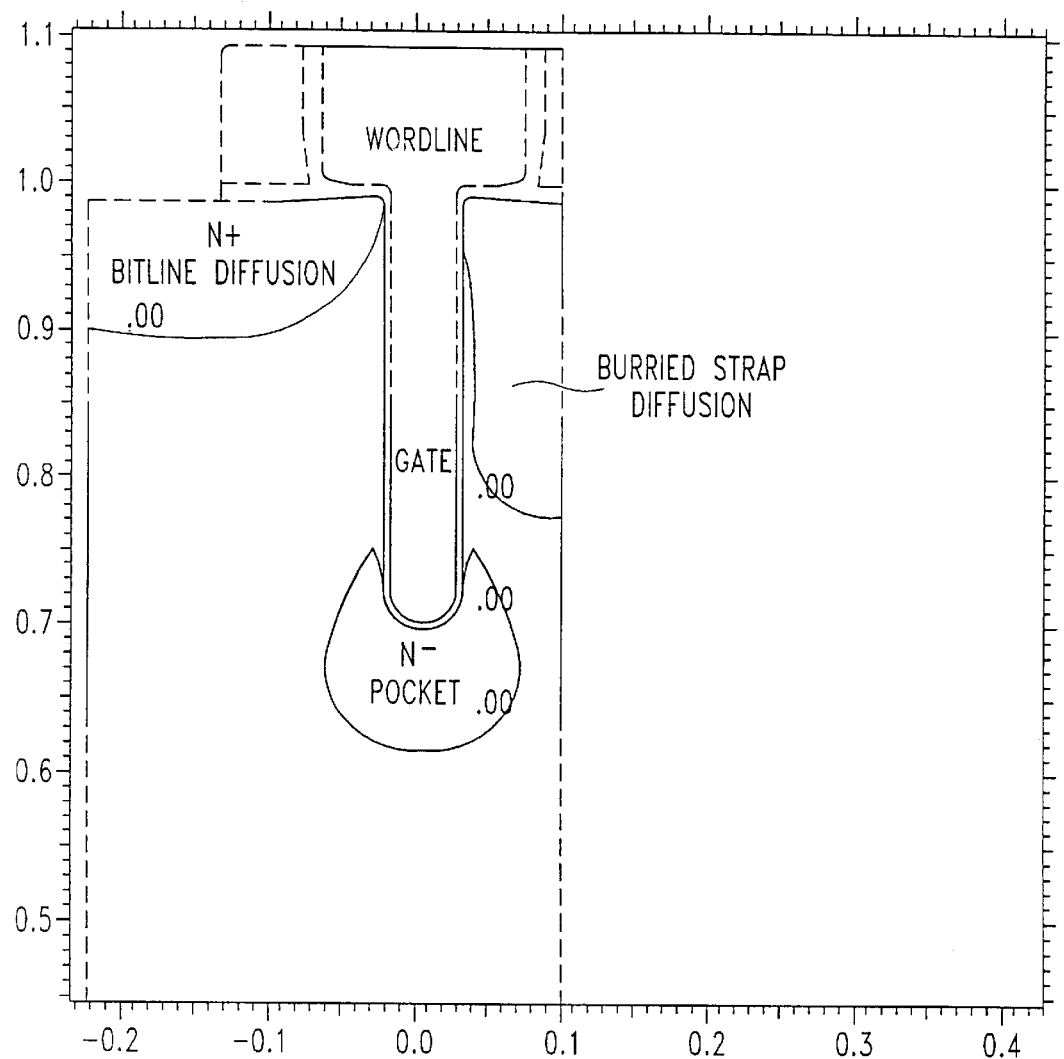
FIG. 9 illustrates a modeled groove MOSFET in a DRAM cell.

FIG. 9 illustrates a modeled groove MOSFET in a DRAM cell. Note that in this diagram, the groove is deeper than the buried-strap diffusion.

Figure 10:
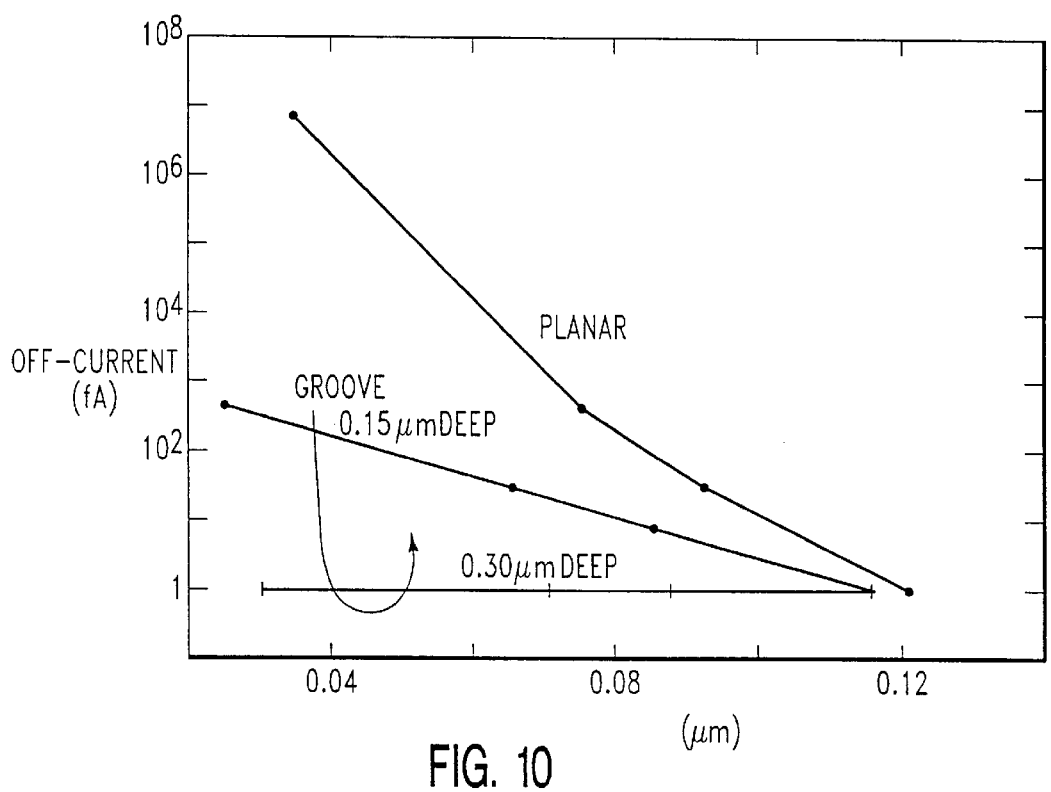
FIG. 10 illustrates modeled sensitivity of MOSFET off-current to distance between bitline diffusion and buried-strap diffusion, $\delta$, for different type MOSFETS.

FIG. 10 illustrates modeled sensitivity of MOSFET off-current to distance between bitline diffusion and buried-strap diffusion, δ, for different type MOSFETS. A planar MOSFET is compared to grooved MOSFETs having groove depths of 0.15 μm and 0.30 μm. The buried-strap diffusion depth for these devices is approximately 0.225 μm. The grooved MOSFETs used in this comparison employ N pockets at the bottom of the groove.

Figure 11:
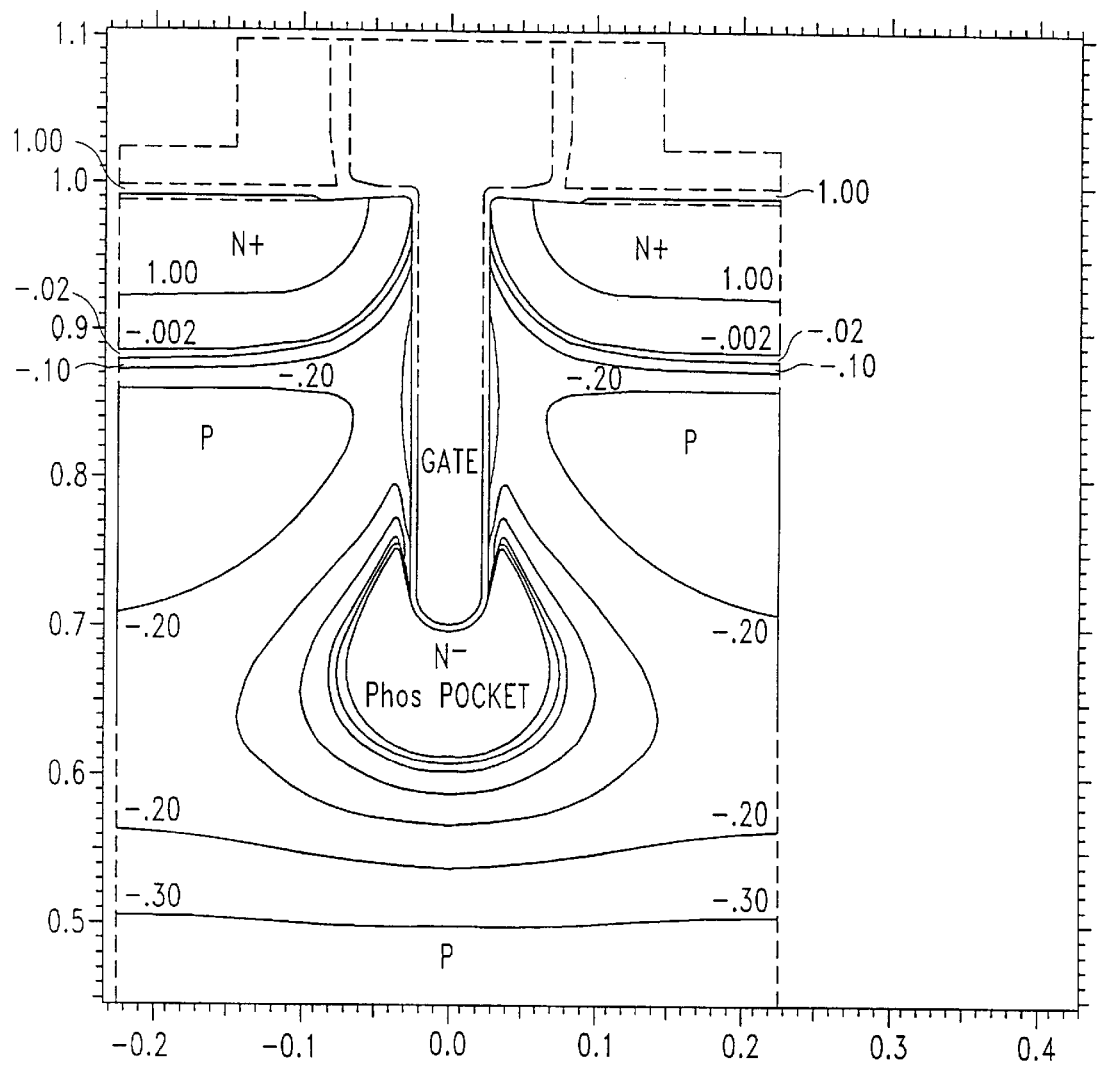
FIG. 11 illustrates modeled doping contours for a grooved MOSFET fabricated with an N phosphorous doped pocket at the bottom of the groove.

FIG. 11 illustrates modeled doping contours for a grooved MOSFET fabricated with an N phosphorus doped pocket at the bottom of the groove. Note that the phosphorous diffuses during subsequent hot processing steps such that the entire curved surface at the bottom of the groove is surrounded by N doping. This doping distribution is very effective for completely eliminating the potential barriers.

Figure 12:
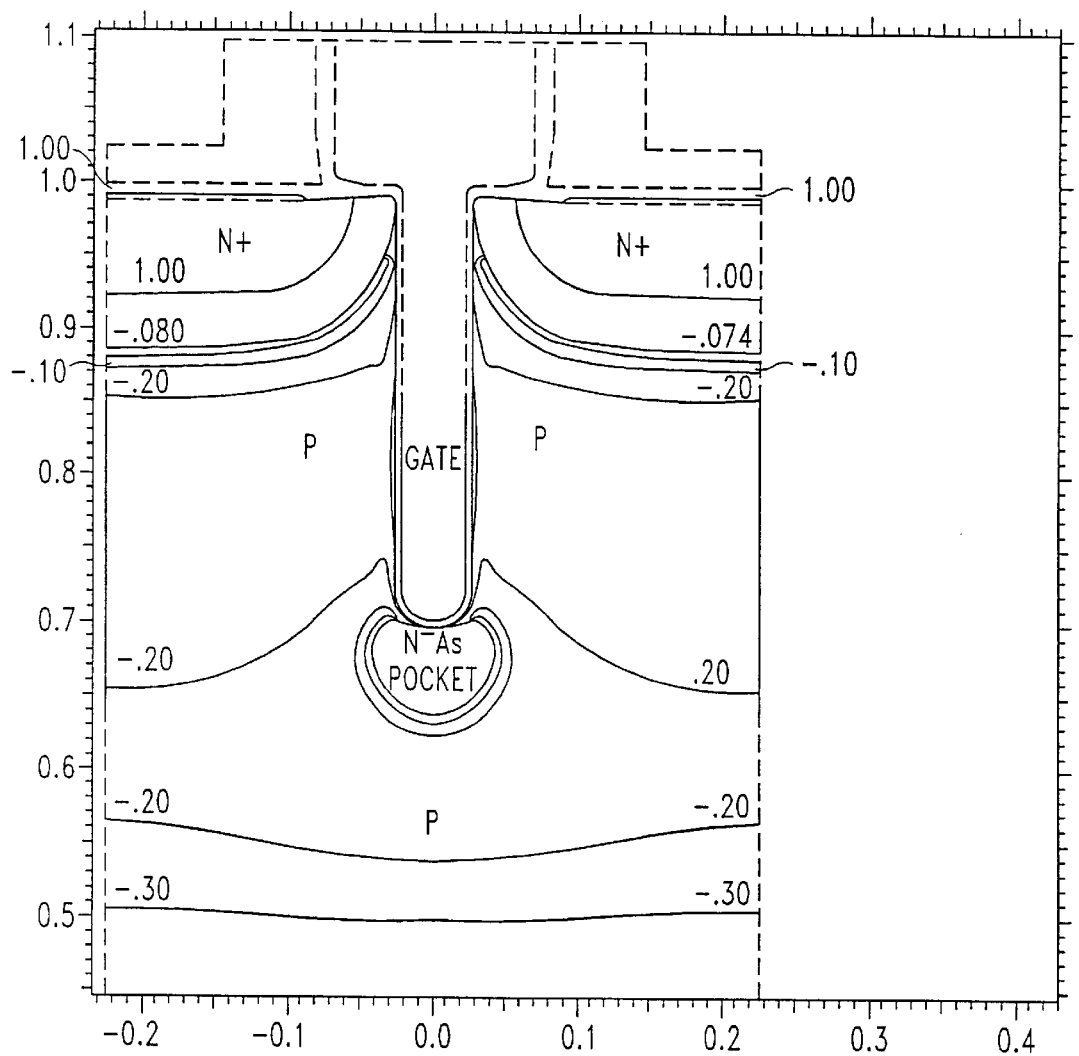
FIG. 12 illustrates modeled doping contours for a grooved MOSFET fabricated with an N arsenic doped pocket at the bottom of the groove.

FIG. 12 illustrates modeled doping contours for a grooved MOSFET fabricated with an N arsenic doped pocket at the bottom of the groove. Note that the size of the pocket is significantly smaller than for phosphorus (FIG. 11) using the same thermal budget, due to differences in diffusivities between phosphorous and arsenic. The arsenic does not diffuse as much around the bottom of the groove as phosphorus. As a result of the small portion of the curved surface which is not covered by the N doping, the arsenic pocket used in this example is somewhat less effective in reducing the potential barriers than is the phosphorus pocket (see FIG. 13). Of course, by adjusting the implant conditions and thermal budget, an arsenic pocket can be made to be as effective as phosphorus.

Figure 13:
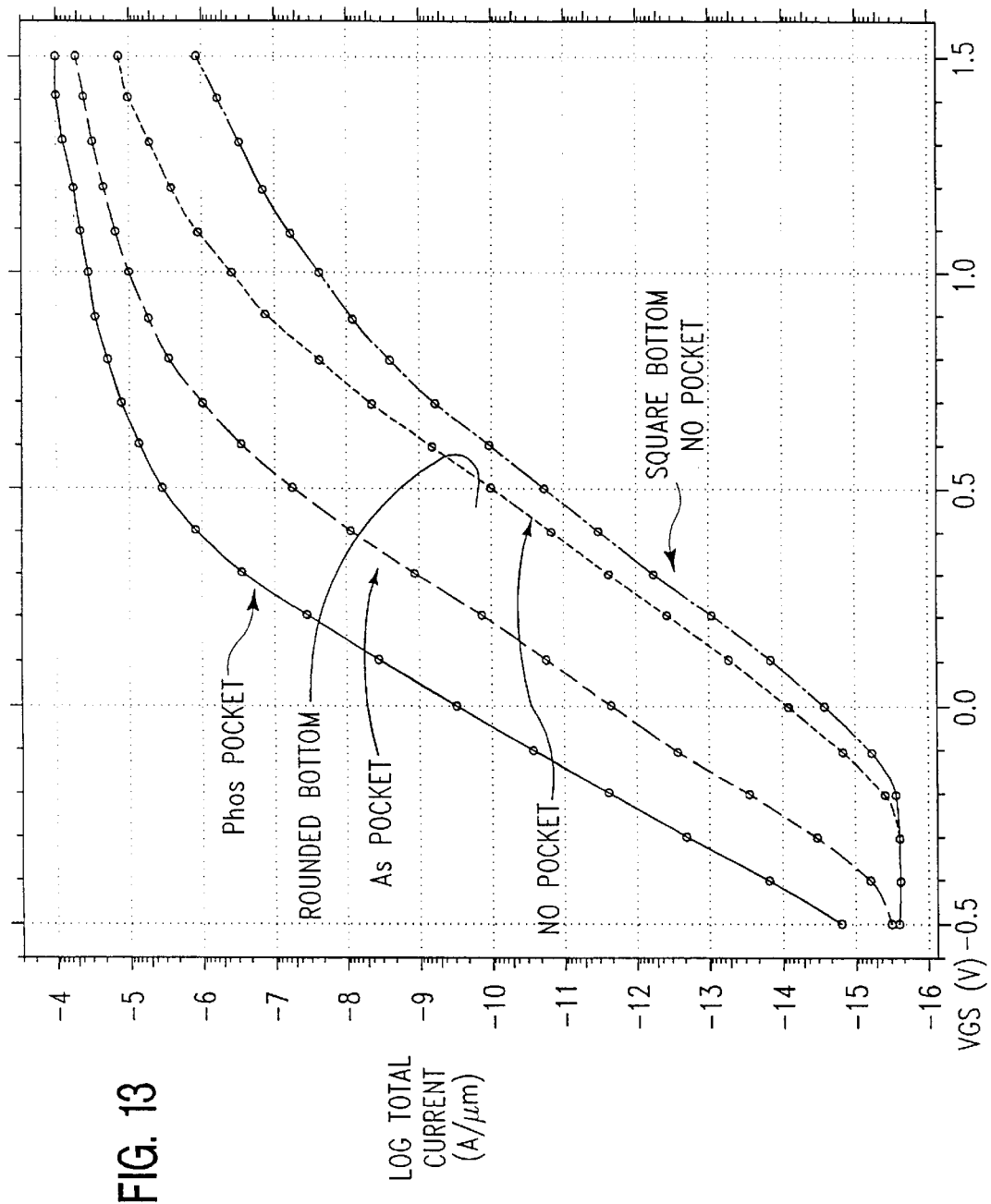
FIG. 13 illustrates a comparison of a modeled $I_d$-$I_{GS}$ characteristics for various grooved MOSFETs.

FIG. 13 illustrates a comparison of modeled $I_D$–$I_{GS}$ characteristics for various grooved MOSFETS. Characteristics of grooved MOSFETs having square bottom with no pocket, rounded bottom with no pocket, rounded bottom with arsenic pocket (as in FIG. 12), and rounded bottom with phosphorus pocket (as in FIG. 11) are shown. Note that the addition of N pockets is much more effective in reducing the sub-threshold swing than is rounding the bottom corners (prior art). Also, larger pockets are more effective in reducing the potential barriers, because they provide N doping which completely covers the curved surface. By adjusting the implant conditions and thermal budget, arsenic can be made to be as effective as the phosphorus pocket used in this example. Operating conditions: $V_{DS}$=1.5 V, T=85° C., 0.3 μm deep groove.

Notes on Processing:

Two embodiments of the formation of N pockets at the bottom of the groove are illustrated here: phosphorus and arsenic.

1) The phosphorus pocket is formed (FIG. 11) by implanting phosphorus ions into the groove at a normal angle of incidence immediately following the groove etch. The mask used for the groove etch is left in place during the phosphorus implant. This is necessary to prevent the phosphorus from counterdoping the vertical sidewalls of the groove. In this example, phosphorous is implanted at a dose of $3 \times 10^{13}$ cm$^{-2}$ and at an energy of 10 keV.

2) An arsenic pocket is formed (FIG. 12) by implanting aresenic ions into the bottom of the groove, following the removal of the groove etch masking layer. It has been found that a thick masking layer on the top horizontal surface of the substrate is not required for arsenic. As a result of arsenic's smaller diffusivity, relative to phosphorus, counterdoping of the groove sidewalls has been found not to be a problem. In this example, arsenic is implanted at a dose of $1.2 \times 10^{13}$ cm$^2$ and at an energy of 20 KeV.

Doping for the channel (vertical sidewalls of the groove) may be provided by either a normally incident implant (P-type, for the case of an NMOSFET, such as boron or indium) prior to the formation of the groove etch mask, or by doing an angled implant into the sidewall of the groove after the groove etch.

While several embodiments and variations of the present invention for a grooved planar DRAM transfer device using buried pocket are described in detail herein, it should be apparent that the disclosure and teachings of the present invention will suggest many alternative designs to those skilled in the art.

Having thus described our invention, what we claim as new, and desire to secure by Letters Patent is:

1. A semiconductor device comprising:

first and second regions of a first conductivity type formed in a substrate of a second conductivity type; and a grooved gate having at least a length formed in a groove located in said substrate between said first second regions;

said grooved gate containing a single transistor cell and having sidewall portions and a bottom portion, wherein said bottom portion is connected to said sidewall portions by bottom corners, and a channel located in said substrate along said entire groove length including along said groove gate sidewall and said bottom portion;

said channel at said bottom portion and said bottom of said grooved gate including a discrete doping region of said first conductivity type where Vt within said channel at said bottom portion and bottom corners is substantially less than Vt within said channel at said sidewall portions, such that said sidewall portions predominately control electric current through the device, wherein said first and second regions of the first conductivity type comprise a source and drain region that abut a portion of said channel, and said channel has a center region between the source and drain, and the doping region of said first conductivity type extends across a portion of the center region but does not extend to the source and drain.

2. The semiconductor device of claim 1, wherein the doped region extends across the entire width of the channel, so that all current flows through the doped region.

3. The semiconductor device of claim 1, comprising an NMOSFET semiconductor device, and the doped region comprises N-type doping.

4. The semiconductor device of claim 3, wherein the doped region is formed by an ion implant of an N-type impurity.

5. The semiconductor device of claim 4, wherein the N-type impurity comprises phosphorous.

6. The semiconductor device of claim 4, wherein the N-type impurity comprises arsenic.

7. The semiconductor device of claim 1, comprising an NMOSFET semiconductor device, and the doped region comprises lightly doped P-type doping.

8. The semiconductor device of claim 1, comprising a PMOSFET semiconductor device, and the doped region comprises P-type doping.

9. The semiconductor device of claim 1, comprising a PMOSFET semiconductor device, and the doped region comprises lightly doped N-type doping.

10. The semiconductor device of claim 1, wherein sidewall sections of said channel located along said gate sidewall portions have a larger length than said gate bottom portion.

11. The semiconductor device of claim 1 further comprising an isolation region formed in said substrate to isolate said semiconductor device said isolation region having a depth which is greater than a depth of said groove.

12. The semiconductor device of claim 1 further comprising a deep trench capacitor formed in said substrate, said deep trench capacitor having a storage electrode electrically connected to one of said first and second regions.

13. The semiconductor device of claim 12, wherein an upper width of said groove between said top sidewall portions is larger than a lower width of said groove between said bottom sidewall portions.

* * * * *